(12) United States Patent
Youn et al.

(10) Patent No.: US 8,278,154 B2
(45) Date of Patent: Oct. 2, 2012

(54) METHOD OF FABRICATING A SEMICONDUCTOR DEVICE PACKAGE INCLUDING A HEAT RADIATION PLATE

(75) Inventors: Han-Shin Youn, Cheonan-si (KR); Young-Shin Kwon, Osan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/278,857

(22) Filed: Oct. 21, 2011

(65) Prior Publication Data

US 2012/0040498 A1 Feb. 16, 2012

Related U.S. Application Data

(62) Division of application No. 12/507,979, filed on Jul. 23, 2009, now abandoned.

(30) Foreign Application Priority Data

Jul. 23, 2008 (KR) .................................. 2008-71759

(51) Int. Cl.
*H01L 21/00* (2006.01)
*H01L 23/495* (2006.01)

(52) U.S. Cl. ........ 438/122; 438/123; 257/675; 257/704; 257/713; 257/720; 257/E23.051

(58) Field of Classification Search .................. None
See application file for complete search history.

(56) References Cited

U.S. PATENT DOCUMENTS

| 6,818,982 | B2 | 11/2004 | Kim |
| 7,061,079 | B2 | 6/2006 | Weng et al. |
| 2004/0173372 | A1* | 9/2004 | Suda ............................ 174/52.4 |
| 2007/0200207 | A1* | 8/2007 | Ramos et al. ................. 257/666 |
| 2008/0048308 | A1* | 2/2008 | Lam ............................... 257/686 |
| 2008/0061414 | A1* | 3/2008 | Retuta et al. .................. 257/676 |

FOREIGN PATENT DOCUMENTS

| KR | 2002-71849 | 9/2002 |
| KR | 2004-3841 | 1/2004 |

* cited by examiner

*Primary Examiner* — Alonzo Chambliss
(74) *Attorney, Agent, or Firm* — Stanzione & Kim, LLP (57) ABSTRACT

A semiconductor device package includes a semiconductor chip including a conductive pad, a die pad on which the semiconductor chip is mounted and having a first thickness, a lead pattern including a first portion disposed adjacent to the edge of the die pad and having the first thickness and a second portion having a second thickness greater than the first thickness, a heat radiation member disposed on the die pad and the lead pattern and including a groove formed at its bottom surface, and a conductive line disposed to electrically connect the conductive pad to the lead pattern corresponding to the conductive pad and partially inserted into the groove.

9 Claims, 7 Drawing Sheets

Fig. 10

METHOD OF FABRICATING A SEMICONDUCTOR DEVICE PACKAGE INCLUDING A HEAT RADIATION PLATE

CROSS-REFERENCE TO RELATED APPLICATIONS

This application is a divisional application of U.S. patent application Ser. No. 12/507,979 filed Jul. 23, 2009, now abandoned, which claims the benefit of Korean Patent Application No. 10-2008-0071759, filed on Jul. 23, 2008, in the Korean Intellectual Property Office, the disclosures of which are incorporated herein in their entirety by reference.

BACKGROUND

1. Field of the Invention

The present general inventive concept relates to semiconductor device packages and, more specifically, to exposed lead semiconductor device packages and methods of fabricating the same.

2. Description of the Related Art

A plurality of semiconductor chips are formed on a semiconductor wafer through various processes. The plurality of semiconductor chips are cut along scribe lines engraved on the semiconductor wafer to be divided into individual semiconductor chips. A package process is performed to mount the individual semiconductor chips on a system board to complete a semiconductor device package. With the marvelous advance in electronic devices and the trend toward smaller and thinner electronic devices, there is a need for lighter, smaller, faster, multi-functional, high-performance, and high-reliability semiconductor device packages. Exposed lead packages (ELPs) are proposed to meet the need. An ELP includes a package body formed to expose bottom surfaces of leads and a die pad on which a semiconductor chip is mounted.

SUMMARY

Exemplary embodiments of the present general inventive concept are directed to a semiconductor device package and a method of forming the same. In an exemplary embodiment, the semiconductor device package may include a semiconductor chip, a die pad, a lead pattern, and a heat radiation member. The semiconductor chip includes s a conductive pad. The die pad includes a top surface on which the semiconductor chip is mounted and a bottom surface facing the top surface and has a first thickness between the top surface and the bottom surface. The lead pattern includes a first portion that is contiguously disposed at the edge of the die pad and has the first thickness and a second portion that is merged with the first portion and has a second thickness greater than the first thickness. The heat radiation member is disposed on the die pad and the lead pattern and includes a groove formed at its bottom surface facing the die pad and the lead pattern. The conductive line is disposed to electrically connect the conductive pad to the lead pattern corresponding to the conductive pad and is partially inserted into the groove.

In another exemplary embodiment, the semiconductor device package may include a conductive plate patterned into a lead pattern and a die pad spaced apart from each other, the lead pattern disposed at an edge of the die pad and including a first portion having a same thickness as and adjacent to the die pad and a second portion having a thickness greater than the thickness of the first portion, the first portion being disposed between the second portion and the die pad; a semiconductor chip including at least one conductive pad and disposed on the die pad; a heat radiation member including opposing ends disposed on the second portions of the lead pattern and including a groove formed at its bottom surface facing the die pad and the first portion of the lead pattern; and a conductive line disposed to electrically connect the at least one conductive pad to the lead pattern corresponding to the conductive pad and partially inserted into the groove.

In another exemplary embodiment, the method of fabricating a semiconductor package may include forming a die pad and a lead pattern from a conductive plate, the lead pattern being contiguously spaced apart from an edge of the die pad and including a first conductive pattern having a first thickness and a second conductive pattern having a second thickness less than the first thickness and disposed between the first conductive pattern and the die pad; forming a plating layer on the second conductive pattern; mounting a semiconductor chip on the die pad using an adhesive layer and forming at least one chip pad on the semiconductor chip; connective a conductive metal line between the plating layer and a corresponding chip pad; forming a heat radiation plate from a conductive material, the radiation plate having a third thickness and a groove formed therein to a fourth thickness less than second thickness; and aligning the radiation layer on the lead pattern such that a first portion of the conductive metal line the groove such that the conductive metal line is isolated from the radiation member.

Additional aspects and utilities of the present general inventive concept will be set forth in part in the description which follows and, in part, will be obvious from the description, or may be learned by practice of the general inventive concept.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

The present general inventive concept will now be described more fully hereinafter with reference to the accompanying drawings, in which preferred embodiments of the general inventive concept are shown. This general inventive concept, however, may be embodied in many different forms and should not be construed as limited to the embodiments set forth herein. Rather, these embodiments are provided so that this disclosure will be thorough and complete, and will fully convey the scope of the general inventive concept to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 1A:
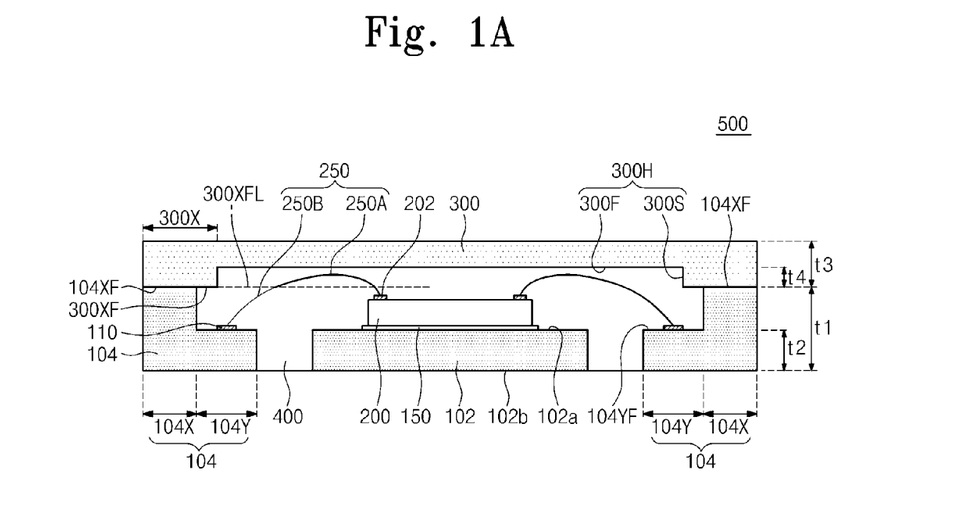
FIG. 1A is a cross-sectional view of a semiconductor device package according to an embodiment of the present general inventive concept.
Figure 1B:
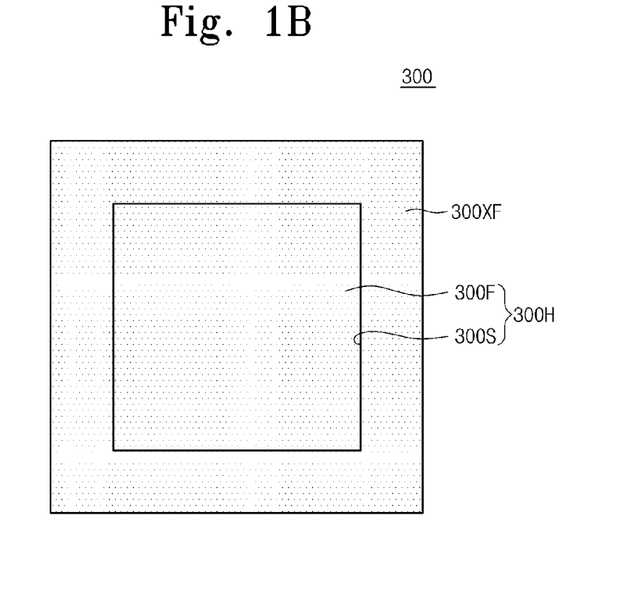
FIG. 1B is a top plan view of a heat radiation member of a semiconductor device package according to an embodiment of the present general inventive concept.

FIG. 1A is a cross-sectional view of a semiconductor device package 500 according to an embodiment of the present general inventive concept, and FIG. 1B is a top plan view of a heat radiation member 300 of the semiconductor device package 500.

As shown in FIGS. 1A and 1B, the semiconductor device package 500 includes a die pad 102, a lead pattern 104, a semiconductor chip 200, the heat radiation member 300, and a molding part 400. The semiconductor device package 500 may be, for example, an exposed lead package (ELP).

The die pad 102 may have a top surface 102a and a bottom surface 102b opposite the top surface 102a. The die pad 102 may have a thickness t2 which may be equivalent to a distance between the top and bottom surfaces 102a and 102b. The die pad 102 may be made of a conductive material having superior electrical and thermal conductivities, for example, a metal such as copper (Cu) or a metal-alloy. The semiconductor chip 200 is mounted on the top surface 102a of the die pad 102. The bottom surface 102b is exposed. Heat, which is generated from the semiconductor chip 200 during the operation of the semiconductor chip 200, can be released through the bottom surface 102b. Furthermore, a ground can be connected to the exposed bottom surface 102b of the die pad 102.

The semiconductor chip 200 is fixed to the die pad 102 by an adhesion layer 150, which may include, for example, an epoxy-based liquid or film-type adhesive or a silicon-based liquid or film-type adhesive. An integrated circuit (not shown) is disposed on the semiconductor chip 200. A plurality of chip pads 202 may be arranged at the edge of the semiconductor chip 200 to be electrically connected to the integrated circuit. Each of the chip pads 202 may be made of a conductive material, for example, a metal such as aluminum (Al) or copper (Cu) or a metal-alloy.

The lead pattern 104 is provided to be contiguously spaced apart from the edge of the die pad 102. The lead pattern 104 may comprise a plurality of lead patterns spaced apart from one another and arranged to correspond to the chip pad 202. The lead pattern 104 may have a bottom surface which is coplanar with the bottom surface 102b of the die pad 102. The lead pattern 104 may include a first lead conductive pattern 104Y having the thickness t2 and a second lead conductive pattern 104X having a thickness t1 greater than the thickness t2. The first lead conductive pattern 104Y may be disposed adjacent to the edge of the die pad 102. The first and second conductive patterns 104Y and 104X may be merged into one pattern.

A plating layer 110 may be disposed on a top surface 104YF of the first lead conductive pattern 104Y. The plating layer 110 may include, for example, silver (Ag) or palladium (Pd). The plating layer 110 serves to improve an electrical connection with a conductive metal line 250.

The heat radiation member 300 may be disposed on the lead pattern 104 and the semiconductor chip 200. The heat radiation member 300 may be made of a conductive material having a superior thermal conductivity, for example, a metal such as copper (Cu) or a metal-alloy. The heat radiation member 300 may be used to release heat generated at the semiconductor chip 200 during the operation of the semiconductor device and to enhance mechanical strength of the semiconductor device package 500.

The heat radiation member 300 may include an edge portion 300X having a thickness t3 and a groove 300H having a depth t4 less than the thickness t3. The edge portion 300X is disposed at the edge of the heat radiation member 300, and the groove 300H is formed at the inner side of the edge portion 300X. A bottom surface 300XF of the edge portion 300X may be in contact with a top surface 104XF of the second lead conductive pattern 104X to be coupled with each other. The groove 300H may be defined by inner side surfaces 300S of the edge portion 300X and a plane 300F connecting the inner side surfaces 300S to each other.

The conductive metal line 250 may be wire-bonded to the chip pad 202 and the plating layer 110 corresponding to the chip pad 202. The conductive metal line 250 may be made of, for example, gold (Au). The wire-bonded conductive metal line 250 may be disposed at a space defined by the plane 300F of the groove 300H, the top surface 104YF of the first lead conductive pattern 104Y, and the top surface 102a of the die pad 102. The conductive metal line 250 may include a first portion 250A that is curved and inserted into the groove 300H and a second portion 250B that is not inserted therein. The first portion 250A may include a curved portion that is disposed adjacent to the chip 202 and higher than a virtual surface 300XFL extending from the bottom surface 300XF of the edge portion 300X of the heat radiation member 300. The second portion 250B may include a nearly straight portion that is disposed adjacent to the plating layer 110 and lower than the virtual surface 300XFL. The depth t4 may be a depth enough to insert the first portion 250A of the conductive metal line 250 therein. The inserted first portion 250a of the conductive metal line 250 is spaced apart from the plane 300F and the inner side surfaces 300S of the groove 300H, electrically isolating the metal conductive line 250 from the heat radiation member 300. An insulating layer (not shown) may be disposed on the inner side surfaces 300S and a plane 300F of the groove 300H such that the inserted first portion 250A of the conductive metal line 250 is contiguously spaced apart from the plane 300F of the groove 300H. The insulating layer may be, for example, a black oxide layer.

As set forth above, the first portion 250A of the conductive metal line 250 may be inserted into the groove 300H. Therefore, a thickness of the semiconductor device package 500 may be reduced by the depth t4 of the groove 300H of the heat radiation member 300, as compared to a case where the heat radiation member 300 would be a flat plate having the thickness t3 without a groove therein. In addition, the semiconductor chip 200 may be disposed on the die pad 102 having the thickness t2 to be as low (distance of the die pad 102 from the virtual surface 300XFL of the heat radiation member 300) as a difference between the thickness t1 and the thickness t2. Therefore, the thickness of the semiconductor device package 500 may be reduced by the difference between the thickness t1 and the thickness t2. As a result, a thinner and lighter semiconductor device package 500 may be achieved.

FIGS. 2 through 7 are cross-sectional views illustrating a method of fabricating a semiconductor device package according to an embodiment of the present general inventive concept.

Figure 2:
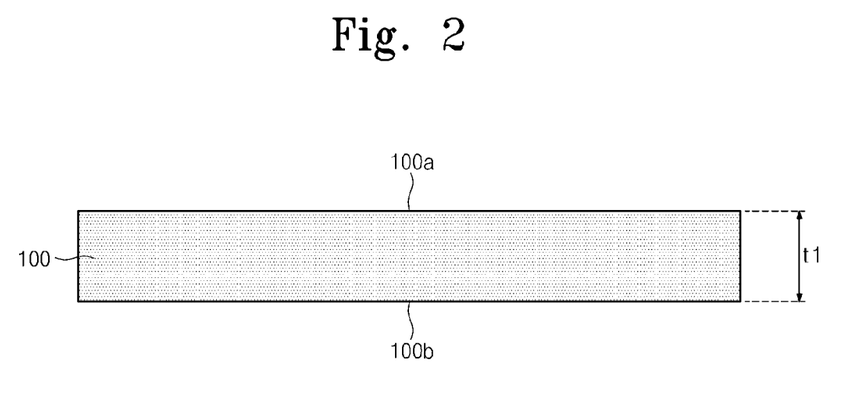
FIGS. 2 through 7 are cross-sectional views illustrating a method of fabricating a semiconductor device package according to an embodiment of the present general inventive concept.

Referring to FIG. 2, there is provided a frame conductive plate 100 including a top surface 100a and a bottom surface 100b opposing the top surface 100a. The frame conductive plate 100 may be formed of a conductive material having superior electrical and thermal conductivity, for example, a metal such as copper (Cu) or a metal-alloy. The frame conductive plate 100 may have, for example, a thickness t1 between the top surface 100a and the bottom surface 100b.

Figure 3:
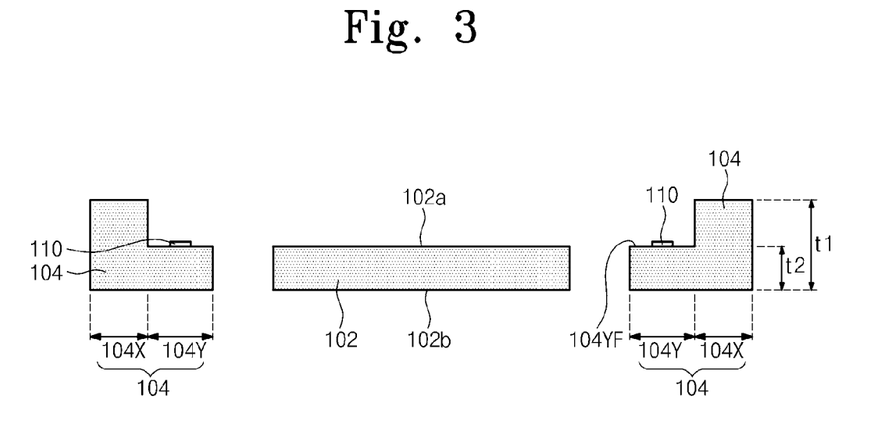

Referring to FIG. 3, the frame conductive plate 100 is patterned to form a die pad 102 and a lead pattern 104. The patterning process may include, for example, a half-etching process or a half-stamping process, which may allow the die pad 102 to have a thickness t2 that is less than the thickness t1.

The lead pattern 104 may be formed to be contiguously spaced apart from the edge of the die pad 102. The lead pattern 104 is formed to correspond to a chip pad (202 in FIG. 1). The lead pattern 104 may comprise a plurality of lead patterns spaced apart from one another. The lead pattern 104 may include a first lead conductive pattern 104Y having the thickness t2 and a second lead conductive pattern 104X having the thickness t1.

A plating layer 110 may be formed on a top surface 104YF of the first lead conductive pattern 104Y. The plating layer 104 may include, for example, silver (Ag) or palladium (Pd). The plating layer 110 serves to improve an electrical connection with a conductive metal line 250 wire-bonded thereto in a subsequent process.

Figure 4:
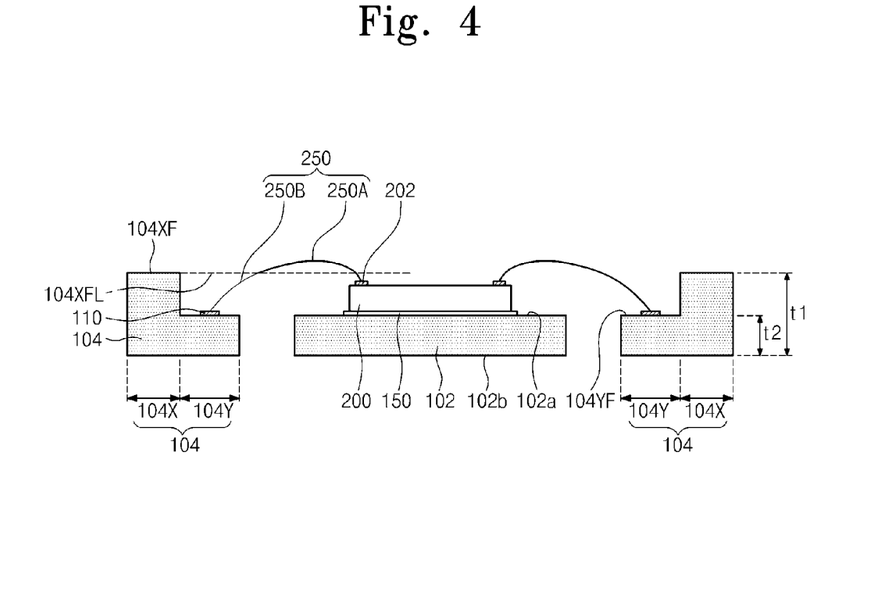

Referring to FIG. 4, a semiconductor chip 200 is mounted on the top surface 102a of the die pad 102 using an adhesion layer 150 which may be formed by means of a dispense technique. The adhesion layer 150 may include, for example, an epoxy-based or silicon-based adhesive of a liquid or film type. An integrated circuit (not shown) is formed on the semiconductor chip 200. A plurality of chip pads 202 may be formed on a top surface of the integrated circuit to be electrically connected to the integrated circuit. The plurality of chip pads 202 may be arranged at the edge of the semiconductor chip 200. The chip pad 202 may be formed of a conductive material, for example, a metal such as aluminum (Al) or copper (Cu) or a metal-alloy.

The chip pad 202 and a corresponding plating layer 110 may be wire-bonded using a conductive metal line 250 which may be formed of, for example, gold (Au). The wire-bonded conductive metal line 250 includes a first portion 250A and a second portion 250B. The first portion 250A may include a portion which is adjacent to the chip pad 202 and higher than a virtual surface 104XFL extending from a top surface 104XF of a first lead conductive pattern 104Y. The second portion 250B may include a portion which is adjacent to the plating layer 205B and lower than the virtual surface 104XFL.

Figure 5:
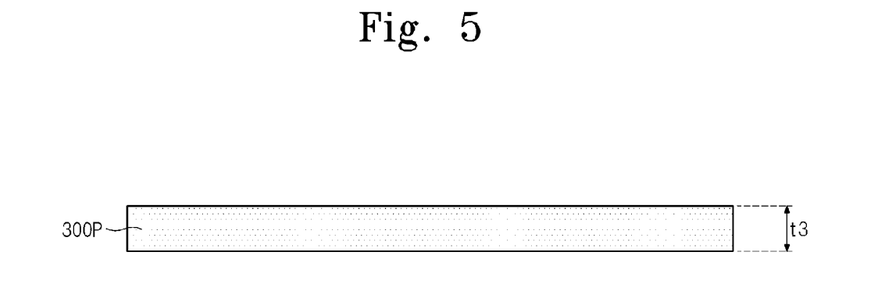

Referring to FIG. 5, a heat radiation plate 300P is provided. The heat radiation plate 300P may be formed of a conductive material having a superior thermal conductivity, for example, a metal such as copper (Cu) or a metal-alloy. The heat radiation plate 300P may have, for example, a third thickness t3.

Figure 6:
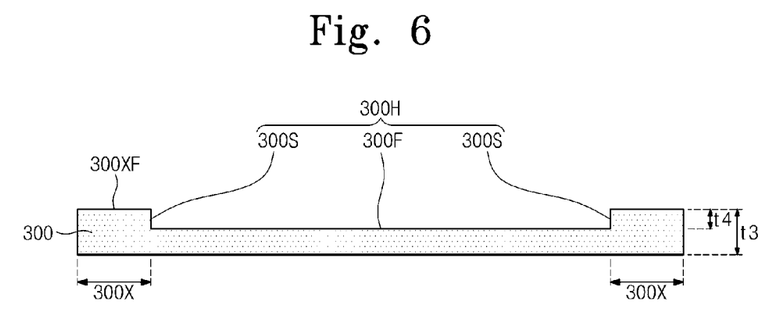

Referring to FIG. 6, a half-etching process may be performed for the heat radiation plate 300P to form an edge portion 300X at the edge of the heat radiation plate 300P and a heat radiation member 300 at the inner side of the edge portion 300X. The edge portion 300X has the thickness t3, and the heat radiation member 300P includes a groove 300H having a depth t4, which is enough to insert the first portion (250A in FIG. 4) of the conductive metal line (250 in FIG. 4) into the groove 300H. The groove 300H may be defined by inner side surfaces 300S of the edge portion 300X and a plane 300F connecting the inner side surfaces 300S to each other.

An insulating layer (not shown) may be formed on the plane 300F and the inner side surfaces 250S. The insulating layer may be, for example, a black oxide layer. The insulating layer may allow the first portion 250A inserted in a subsequent process to be contiguously spaced apart from the plane 300F and the inner side surfaces 300S.

Figure 7:
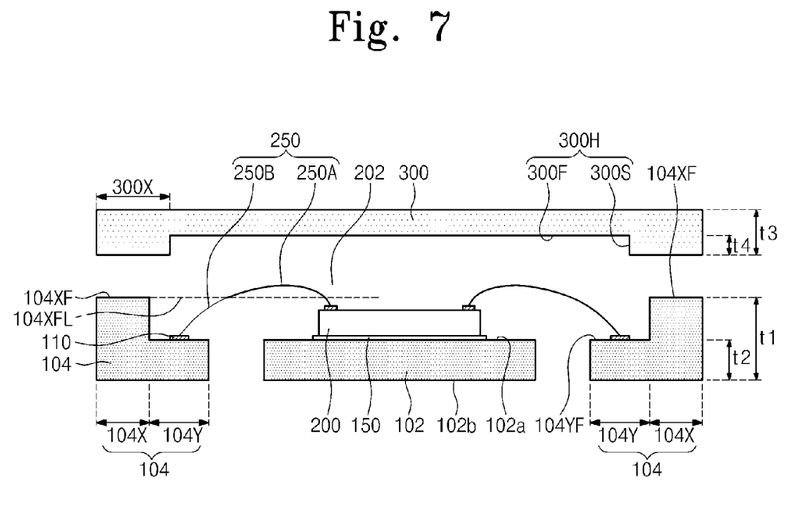

Referring to FIG. 7, the heat radiation member 300 is aligned on the lead pattern 104 and the die pad 102 to insert the first portion 250A of the conductive metal line 250 into the groove 300H. The edge portion 300X of the heat radiation member 300 is coupled with the top surface 104XF of the second lead conductive pattern 104X.

Returning to FIG. 1A, the inserted first portion 250A of the conductive metal line 250 is spaced apart from the plane 300F and the inner side surfaces 300S of the groove 300H to electrically isolate the conductive metal line 250 from the heat radiation member 300. The first portion 250A may include a curved portion which is adjacent to the chip pad 202 and higher than the virtual surface 300XFL extending from the bottom surface 300XF of the edge portion 300X of the heat radiation member 300. The second portion 250B may include a nearly straight portion which is adjacent to the molding layer 110 and lower than the virtual surface 300XFL.

By injecting a molding material between the lead patterns 104 spaced apart from each other and between the lead pattern 104 and the die pad 102, a molding part 400 may be formed to mold the semiconductor chip 200, the die pad 102, the lead pattern 104, the conductive metal line 250, and the heat radiation member 300. The molding part 400 may be formed of a molding resin such as, for example, epoxy molding compound (EMC). A bottom surface of the die pad 102 and a bottom surface of the lead pattern 104 are exposed externally. The exposed bottom surface of the lead pattern 104 may be used for electrical connection with external sources.

According to this embodiment, a thickness of the semiconductor device package 500 may be reduced by a thickness which is equivalent to the depth t4 of the groove 300H of the heat radiation plate 300P. In that the die pad 102 has a second thickness t2, the thickness of the semiconductor device package 500 may be reduced by a difference between the first thickness t1 and the second thickness t2. Thus, the semiconductor device package 500 may become thinner and lighter.

Figure 8A:
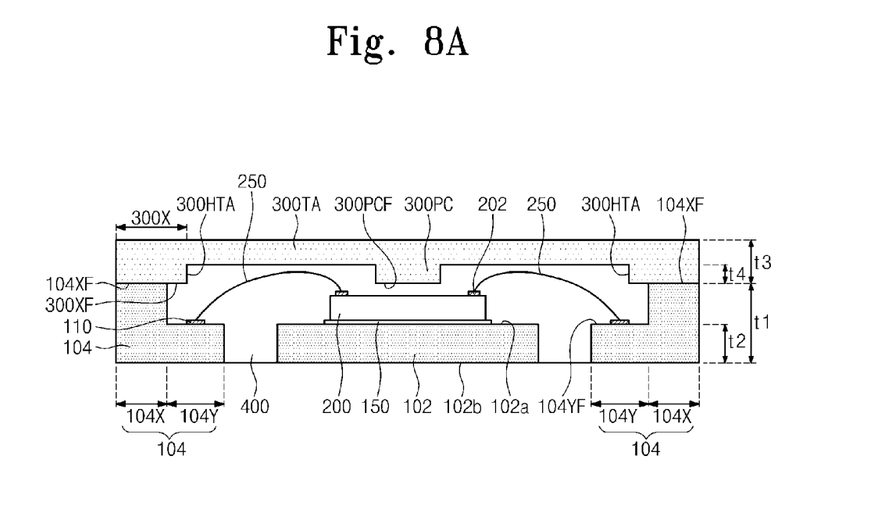
FIG. 8A is a cross-sectional view of a semiconductor device package according to an alternative embodiment of the present general inventive concept.
Figure 8B:
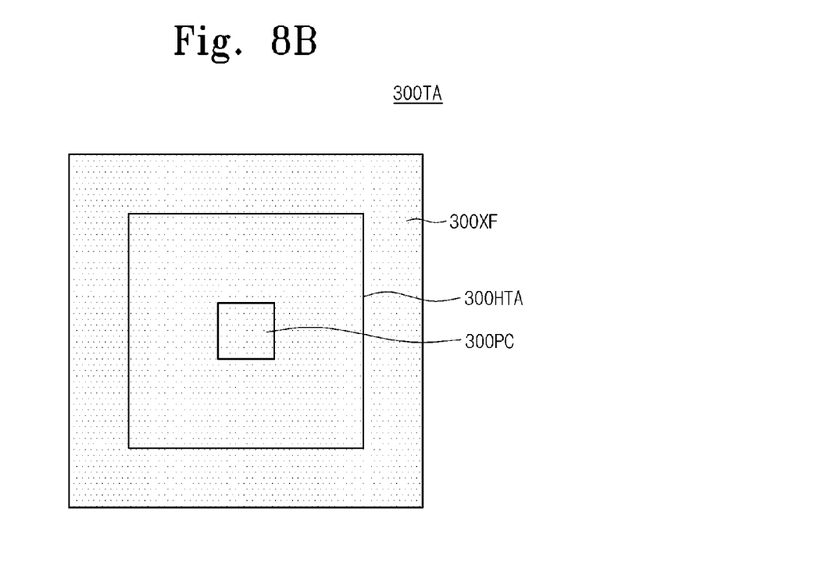
FIG. 8B is a top plan view of a heat radiation member of a semiconductor device package according to the alternative embodiment of FIG. 8A.

FIG. 8A is a cross-sectional view of a semiconductor device package according to an alternative embodiment of the present general inventive concept, and FIG. 8B is a top plan view of a heat radiation member of the semiconductor device package shown in FIG. 8A. The semiconductor device package according to the present alternative embodiment may be similar to that according to the foregoing embodiment. Thus, duplications thereof will be explained briefly or omitted.

Referring to FIGS. 8A and 8B, a heat radiation member 300TA may include an edge portion 300X formed at the edge of the heat radiation member 300TA and having a thickness t3, a central portion 300PC aligned to a mounted semiconductor chip 200 and having a thickness t3, and a groove 300HTA formed between the edge portion 300X and the central portion 300PC having a depth t4 which is less than the thickness t3. The groove 300HTA surrounds the central portion 300PC and may be defined by inner side surfaces of the edge portion 300X and a plane connected to the inner side surfaces. A bottom surface 300PCF of the central portion 300PC and a bottom surface of the edge portion 300XF may be coplanar with each other. Since the bottom surface 300PCF of the central portion 300PC has a smaller width than a top surface of the semiconductor chip 200, the central portion 300PC may be spaced apart from a chip pad 202 and a conductive metal line 250 which is contiguously connected to the chip pad 202. In addition, a bottom surface 300PCF of the central portion 300PC may be contiguously spaced apart from the top surface of the semiconductor chip 200.

Unlike the previous embodiment, the heat radiation member 300TA of the embodiment of FIG. 8A may effectively release heat generated at the semiconductor chip 200 through the central portion 300PC.

Figure 9A:
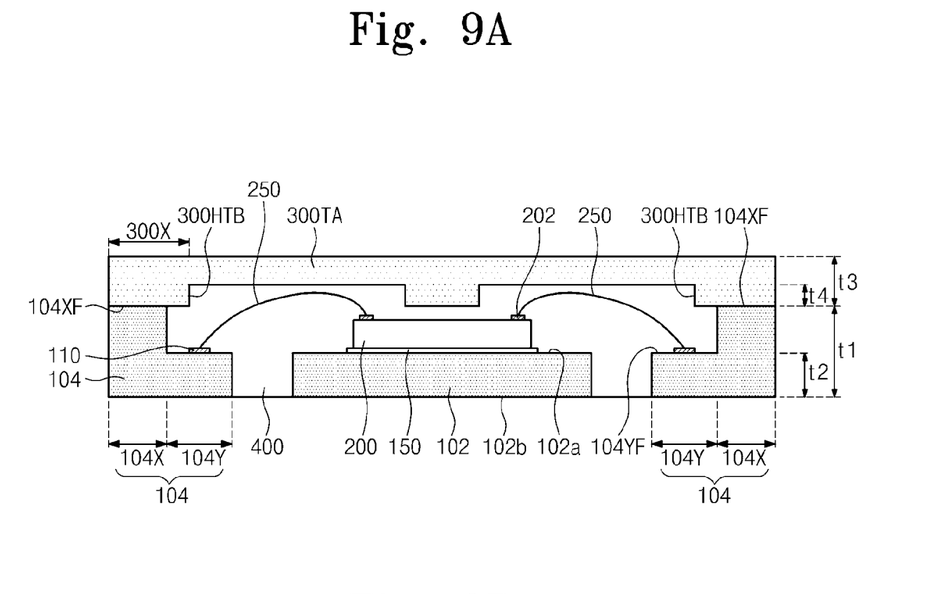
FIG. 9A is a cross-sectional view of a semiconductor device package according to another alternative embodiment of the present general inventive concept.
Figure 9B:
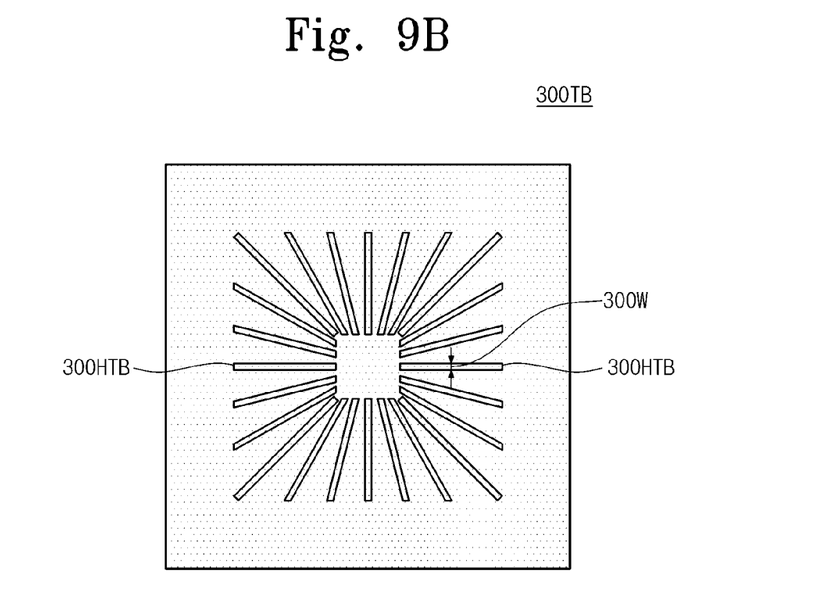
FIG. 9B is a top plan view of a heat radiation member of the semiconductor device package according to the alternative embodiment of FIG. 9A.

FIG. 9A is a cross-sectional view of a semiconductor device package according to yet another alternative embodiment of the present general inventive concept, and FIG. 9B is a top plan view of a heat radiation member of the semiconductor device package shown in FIG. 9A. The semiconductor device package according to this alternative embodiment may be similar to that according to the foregoing embodiment. Thus, duplications thereof will be explained briefly or omitted.

Referring to FIGS. 9A and 9B, a plurality of grooves 300HTB may be formed at a bottom surface of a heat radiation plate 300TB to correspond to a plurality of conductive metal lines 250, respectively. Each groove 300HTB has a small width 300W, so that only one conductive metal line 250 may be inserted into the groove 300HTB. Each of the grooves 300HTB has a depth t4.

Unlike the previous embodiment, the groove 300HTB may be formed to have the small width 300W, so that only one conductive metal line 250 may be inserted into the groove 300HTB. Thus, the heat radiation member 300TB may have a wide area, releasing heat generated at a semiconductor chip 200, correspond to a bottom surface of the heat radiation member 300TB.

Figure 10:
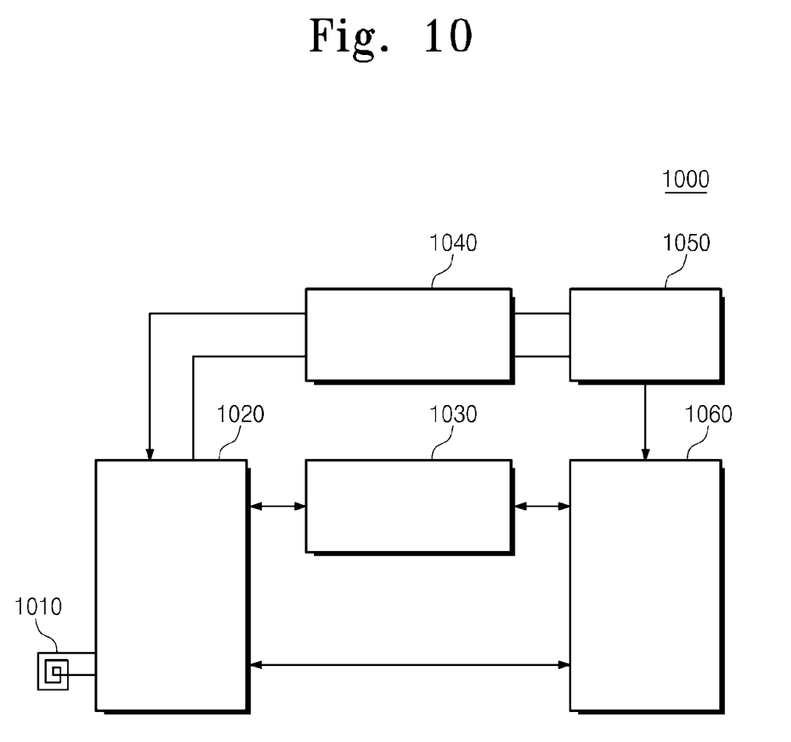
FIG. 10 is a block diagram of a system of electronic equipment including a semiconductor device package according to an embodiment of the present general inventive concept.

FIG. 10 is a block diagram illustrating a system of an electronic equipment including a semiconductor device package according to an embodiment of the present general inventive concept. The system may include a mobile communication terminal 1000 including, for example, a radio frequency communication chip (RF chip) 1020, a smart card 1030, a switching circuit 1040, a battery 1050, and a controller 1060. The mobile communication terminal 1000 may include a semiconductor device package 500 according to embodiments of the present general inventive concept. That is, the mobile communication terminal 1000 may be a thin and light electronic device because the semiconductor device package 500 is thin and light.

The semiconductor device package 500 according to the embodiments of the present general inventive concept may be manufactured with, for example, a memory chip or a logic chip. The RF chip 1020 may include, for example, a processor and a memory chip. The smart card 1030 may include a memory chip, and the controller 1060 may include a logic chip.

The RF chip 1020 transmits/receives wireless signals to/from an external RFID reader (not shown) through an antenna 1010. The RF chip 1020 transmits a signal received from the smart card 1030 or the controller 1060 to the RFID reader and transmits a signal received from the RFID reader through the antenna 1010 to the smart card 1030 or the controller 1060. The smart card 1030 communicates with the RF chip 1020 and the controller 1060. The battery 1050 supplies power that the mobile communication terminal 1000 needs. The controller 1060 controls general operations of the mobile communication terminal 1000.

The electronic equipment including a semiconductor device package 500 according to the present general inventive concept may include, for example, not only a mobile communication terminal 1000 but also various mobile devices such as personal digital assistants (PDA), MP3 players, movie players, portable game machines, desktop computers, mainframe computers, global positioning systems (GPS), PC cards, notebook computers, camcorders, and digital cameras.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents

What is claimed is:

1. A method of fabricating a semiconductor package, the method comprising:

forming a die pad and a lead pattern from a conductive plate, the lead pattern being contiguously spaced apart from an edge of the die pad and including a first conductive pattern having a first thickness and extending higher than the die pad, and a second conductive pattern having a second thickness less than the first thickness and disposed between the first conductive pattern and the die pad;

forming a plating layer on the second conductive pattern;

mounting a semiconductor chip having at least one chip pad on the die pad using an adhesive layer;

connecting a conductive metal line between the plating layer and a corresponding chip pad;

forming a heat radiation plate from a conductive material, the heat radiation plate having a third thickness and a groove formed therein to a fourth thickness less than third thickness; and aligning the heat radiation plate on the lead pattern such that end portions of the heat radiation plate contacting the first conductive pattern are higher than a height of the semiconductor chip, and a portion of the conductive metal line is located in the groove and isolated from the heat radiation plate.

2. The method of claim 1, wherein the die pad and lead pattern are formed by a half-etching process or a half-stamping process.

3. The method of claim 1, wherein the plating layer is formed to include silver or palladium.

4. The method of claim 1, wherein the adhesive layer is formed by a dispense technique.

5. The method of claim 4, wherein the adhesive layer includes an epoxy-based or silicon-based adhesive of a liquid or film type.

6. The method of claim 1, wherein the conductive metal line includes a first portion which is connected to the chip lad and is curved to be inserted into the groove and a second portion which is connected to the plating layer and is less curved than the first portion.

7. The method of claim 1, wherein the lead pattern comprises a plurality of lead patterns spaced apart from each other.

8. The method of claim 7, further comprising:

injecting a molding material between the lead patterns spaced apart from each other and between the lead pattern and the die pad such that a molding part is formed to mold the semiconductor chip, the die pad, the lead patterns, the conductive metal line and the heat radiation plate.

9. The method of claim 1, wherein the heat radiation plate includes a central portion having the third thickness and formed in the middle of the groove portion.

* * * * *